United States Patent
Tu et al.

(10) Patent No.: US 8,222,136 B2
(45) Date of Patent: Jul. 17, 2012

(54) METHOD OF FORMING CONTACTS FOR A SEMICONDUCTOR DEVICE

(75) Inventors: Yuan-Tien Tu, Puzih (TW); Tsai-Chun Li, Hsinchu (TW); Huan-Just Lin, Hsinchu (TW); Shih-Chang Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/906,868

(22) Filed: Oct. 18, 2010

(65) Prior Publication Data
US 2012/0094485 A1   Apr. 19, 2012

(51) Int. Cl.
*H01L 21/4763* (2006.01)
(52) U.S. Cl. ............... 438/637; 438/690; 257/E21.224; 257/E21.577
(58) Field of Classification Search ............ 257/E21.224
See application file for complete search history.

(56) References Cited

U.S. PATENT DOCUMENTS

| 7,253,100 | B2* | 8/2007 | DellaGuardia et al. | 438/637 |
| 2006/0128166 | A1* | 6/2006 | Nakata et al. | 438/795 |
| 2007/0093050 | A1* | 4/2007 | Son et al. | 438/618 |
| 2007/0161218 | A1* | 7/2007 | Ichinose et al. | 438/519 |
| 2008/0311711 | A1* | 12/2008 | Hampp et al. | 438/197 |

* cited by examiner

*Primary Examiner* — Ha Tran T Nguyen
*Assistant Examiner* — Shaka Scarlett
(74) *Attorney, Agent, or Firm* — Haynes and Boone, LLP

(57) ABSTRACT

The present disclosure provides a method of fabricating a semiconductor device. The method includes forming a layer over a substrate. The method includes forming a first opening in the layer that exposes a first region of the substrate. The method includes removing a first oxidation layer formed over the first region through a first sputtering process. The method includes filling the first opening with a conductive material. The method includes forming a second opening in the layer that exposes a second region of the substrate, the second region being different from the first region. The method includes removing a second oxidation layer formed over the second region through a second sputtering process. One of the first and second sputtering processes is more powerful than the other.

20 Claims, 8 Drawing Sheets

METHOD OF FORMING CONTACTS FOR A SEMICONDUCTOR DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

To provide electrical connections between elements of a transistor on the IC (such as gate, source, and drain) and external devices, conductive contacts and vias are formed in the IC. During the formation of the contacts, oxidation of the surfaces of the contacts may occur. The oxidation results in an oxidation material formed on the contact surface, such as a metal oxide, that may degrade the performance of the IC. For example, contact resistance for one or more elements of the transistor may vary out of a desired range. Therefore, it is desirable to remove such oxidation material. However, it is difficult for traditional methods to sufficiently remove the oxidation material on the contact surfaces without damaging parts of the transistor. As a result, ICs fabricated with traditional methods may not have optimal performance.

Therefore, while existing methods of forming contacts for transistor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
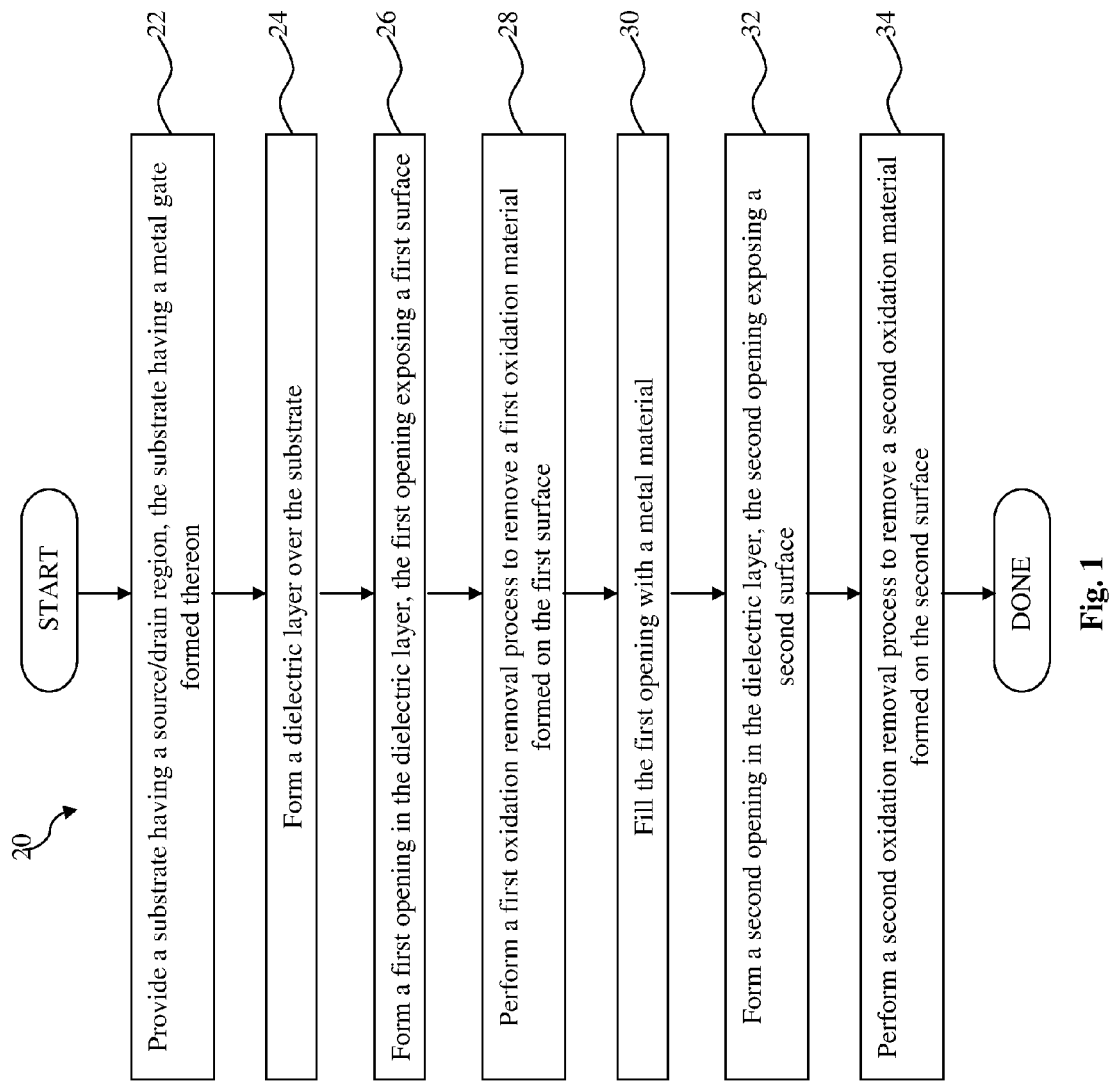
FIG. 1 is a flowchart illustrating a method of forming a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 20 for fabricating a semiconductor device. The method 20 begins with block 22 in which a substrate having a source/drain region is provided. The substrate has a metal gate formed thereon. The method 20 continues with block 24 in which a dielectric layer is formed over the substrate. The dielectric layer covers the source/drain region and the metal gate. The method 20 continues with block 26 in which a first opening is formed in the dielectric layer. The first opening extends through the dielectric layer and exposes a first surface. The first surface is a surface of one of the metal gate and the source/drain region. The method continues with block 28 in which a first oxidation removal process is performed to remove a first oxidation material formed on the first surface. The method 20 continues with block 30 in which the first opening is filled with a metal material. The method 20 continues with block 32 in which a second opening is formed in the dielectric layer. The second opening extends through the dielectric layer and exposes a second surface. The second surface is different from the first surface and is a surface of the other one of the metal gate and the source/drain region. For example, if the first surface is the surface of the metal gate, then the second surface is the surface of the source/drain region. If the first surface is the surface of the source/drain region, then the second surface is the surface of the metal gate. The method 20 continues with block 34 in which a second oxidation removal process is performed to remove a second oxidation material formed on the second surface. The first and second oxidation removal processes have different intensities. The process intensities can relate to their respective direct-current (DC) bias voltage levels and/or the processing times.

FIGS. 2-8 are diagrammatic fragmentary cross-sectional side views of a semiconductor device 40 at various stages of fabrication in accordance with various aspects of the present disclosure. It is understood that FIGS. 2-8 have been simplified for a better understanding of the inventive concepts of the present disclosure. Accordingly, it should be noted that additional processes may be provided before, during, and after the processes shown in FIGS. 2-8, and that some other processes may only be briefly described herein.

Figure 2:
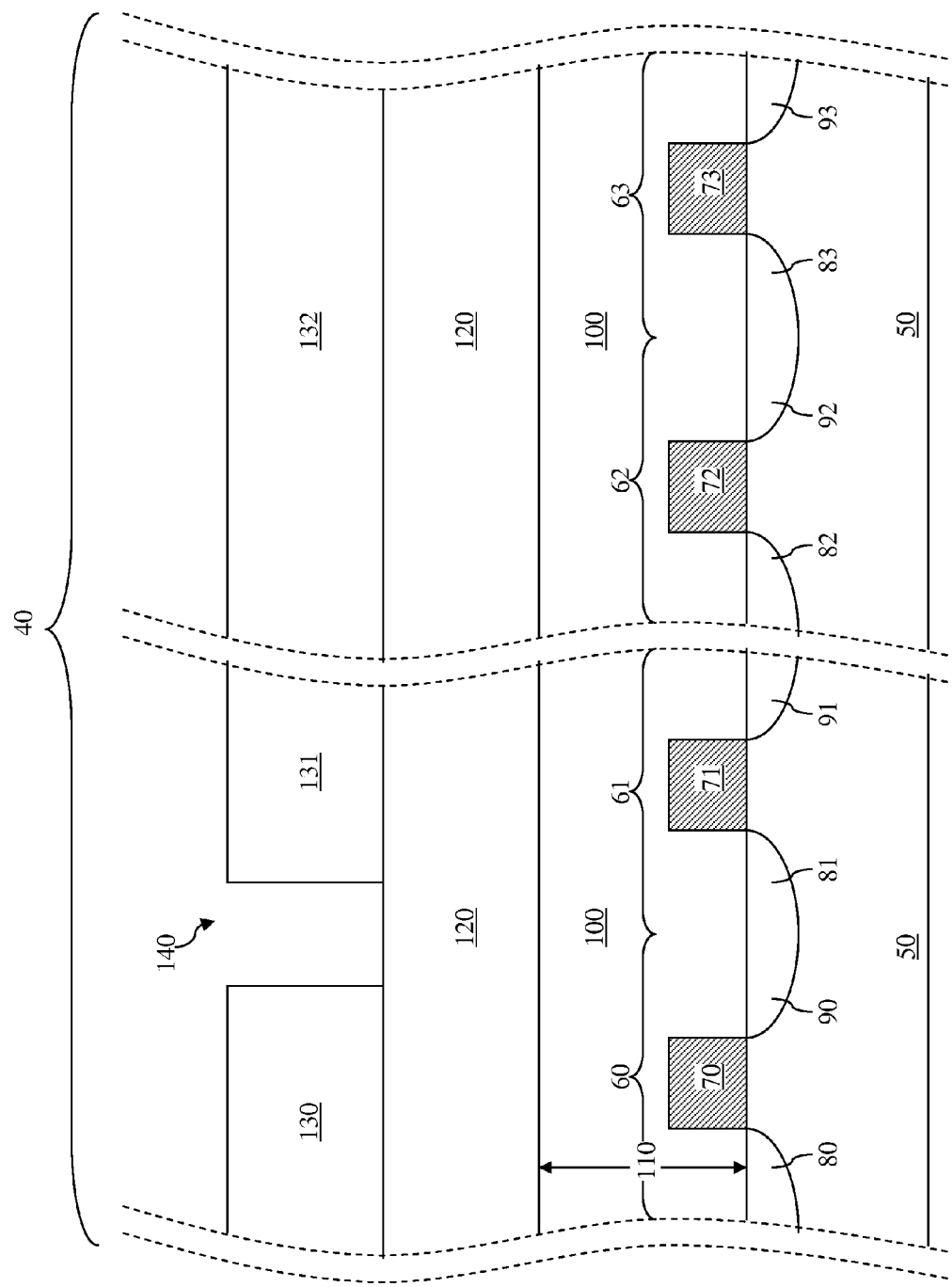
FIGS. 2-8 are diagrammatic fragmentary cross-sectional side views of a semiconductor device at various stages of fabrication in accordance with various aspects of the present disclosure.

Referring to FIG. 2, the semiconductor transistor device 40 includes a substrate 50. The substrate 50 is a silicon substrate that is doped with either a P-type dopant or an N-type dopant. The P-type dopant may be boron, and the N-type dopant may be phosphorous or arsenic. The substrate 50 may include other elementary semiconductors such as germanium. The substrate 50 may optionally include a compound semiconductor and/or an alloy semiconductor. Further, the substrate 50 may include an epitaxial layer (epi layer), may be strained for performance enhancement, and may include a silicon-on-insulator (SOI) structure.

The semiconductor device 40 also includes a plurality of transistor devices that are partially formed in the substrate 50. For the sake of simplicity, only transistor devices 60, 61, 62, and 63 are shown as examples. The transistor devices 60-63 are metal oxide semiconductor field effect transistor (MOSFET) devices. The transistor devices 60-63 include gates 70-73. The gates 70-73 each include a gate dielectric layer and a gate electrode layer. In an embodiment, the gate dielectric layer includes a high-k dielectric material, which is defined as a material having a dielectric constant that is higher than the dielectric constant of silicon. The gate electrode layer includes metal materials, which may include a fill metal portion that serves as a main conductive portion of the gate and a work function metal portion that tunes the work function of the gate. Thus, the gates 70-73 may also be referred to as metal gates.

The transistor devices 60-63 also include source regions 80-83, and drain regions 90-93, respectively. It is understood that the source regions 80-83 and the drain regions 90-93 may be interchangeable. In other words, the source regions 80-83 may serve as drain regions, and the drain regions 90-93 may serve as source regions. As such, the source regions 80-83 and the drain regions 90-93 are referred to as source/drain regions hereinafter. The source/drain regions 80-83 and 90-93 are formed in an active region (OD) of the substrate 50. Also, as shown in FIG. 2, the source/drain regions 90 and 81 may be coupled together, and the source/drain regions 92 and 83 may be coupled together. The source/drain regions 80-83 and 90-93 are formed by doping portions of the substrate 50 through various ion implantation processes.

Although not illustrated for the sake of simplicity, it is understood that the gates 70-73 may include spacers formed on the sidewalls of the gates, and the source/drain regions 80-83 and 90-93 may include lightly-doped source/drain (LDD) regions and heavily doped source/drain regions.

A contact-etch stop layer (CESL) is formed over the substrate 50 and over the gates 70-73. The CESL layer is not illustrated herein for the sake of simplicity. Thereafter, a dielectric layer 100 is formed over the CESL layer. The dielectric layer 100 may also be referred to as an inter-layer dielectric (ILD). In an embodiment, the dielectric layer 100 includes a low-k dielectric material. The dielectric 100 may also include an oxide material. The dielectric layer 100 has a thickness 110 measured in a vertical direction. In an embodiment, the thickness 110 is in a range from about a height of the gates 70-73 to about 1000 Angstroms. The dielectric layer 100 may be formed by a deposition process known in the art, such as chemical vapor deposition (CVD), physical vapor deposition (PVD), atomic layer deposition (ALD), or combinations thereof.

An intermediate layer 120 is then formed over the dielectric layer 100. The intermediate layer 120 may include a plurality of layers. In one embodiment, the intermediate layer 120 includes a bottom anti-reflective coating (BARC) layer, a dielectric anti-reflective coating (DARC) layer, and an ashing-removable dielectric (ARD) layer. In another embodiment, the intermediate layer 120 includes a middle layer and a bottom layer. The middle layer may include a silicon-rich BARC layer with a silicon content being in a range from about 1% to about 99%. The bottom layer may include a photoresist material. For the sake of simplicity, all these layers in the different embodiments are collectively illustrated as the intermediate layer 120 herein.

A patterned photoresist layer is then formed over the intermediate layer 120. The patterned photoresist layer includes a plurality of photoresist portions that are formed by depositing a layer of photoresist material on the intermediate layer 120 (for example through a spin coating process) and thereafter performing various masking, exposing, developing, baking, and stripping/ashing processes. In the embodiment shown in FIG. 2, photoresist portions 130, 131, and 132 are formed as examples. The photoresist portions 130-131 are separated by an opening 140. The opening 140 is located above a portion of the source/drain regions 90 and 81.

Figure 3:
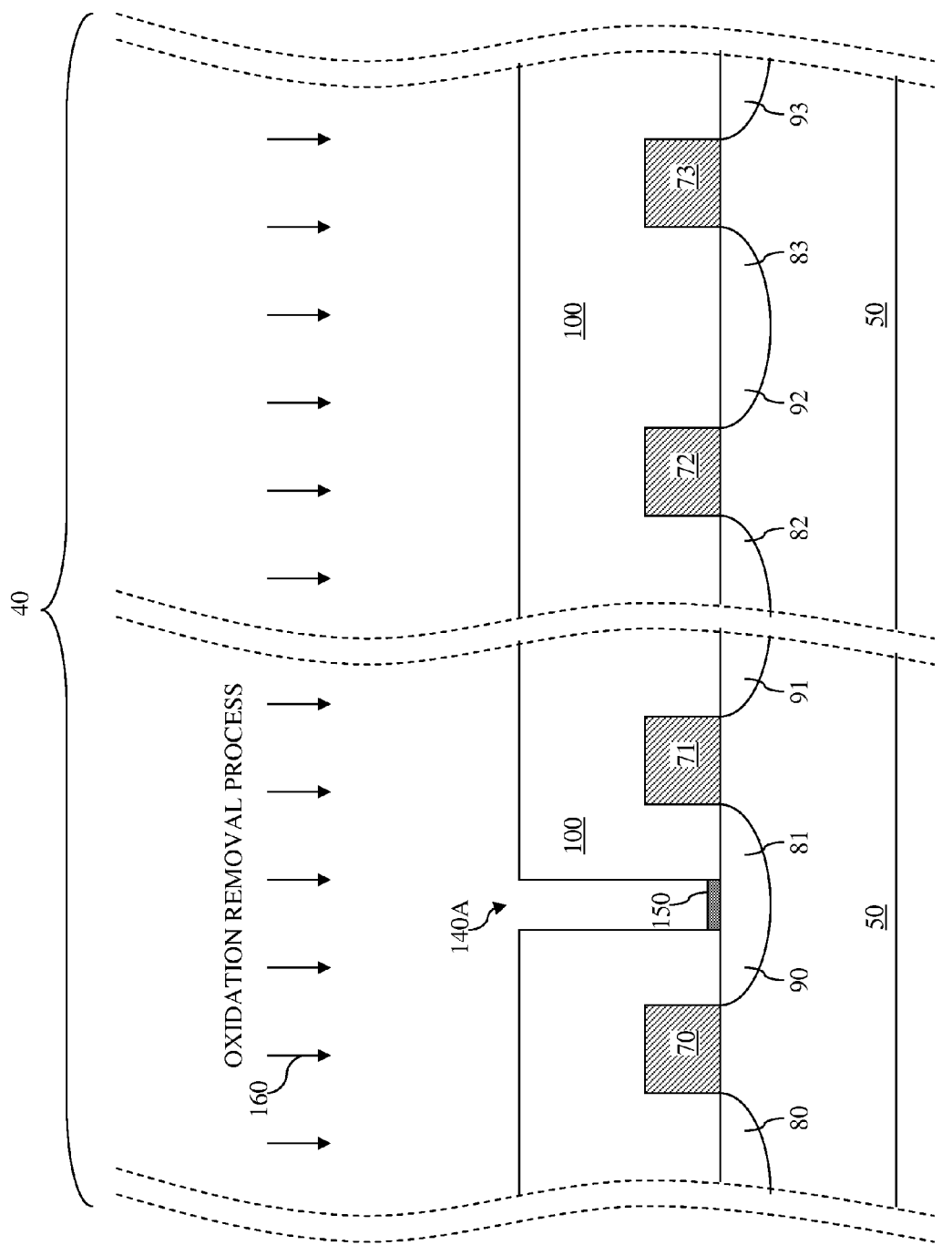

Referring now to FIG. 3, an etching process is performed to etch the opening 140 further downward until the opening extends through the dielectric layer 100. The patterned photoresist portions 130-132 and the intermediate layer 120 are then removed. At this point, the opening 140 becomes an opening 140A. The opening 140A is narrower than the opening 140. The opening 140A exposes a surface of a portion of the source/drain regions 90 and 81. A conductive contact will be formed inside the opening 140A in a later process to establish electrical connection between the source/drain regions 90 and 81 and external devices.

A wet cleaning process is also performed to clean the surfaces of the semiconductor device 40 after the etching process (that forms the opening 140A) is performed. The wet cleaning process uses a substantially acid-free cleaning agent. For example, the cleaning agent may be de-ionized water.

Silicide is formed on the surface of the source/drain regions 90 and 81 exposed by the opening 140A. In an embodiment, the silicide is a nickel silicide. Due to exposure to oxygen in the air, an oxidation material 150 (also referred to as an oxidation layer) is formed on the silicide. As mentioned above, a conductive contact will eventually be formed inside the opening 140A. This oxidation material 150 on the silicide surface will increase the contact resistance, which degrades the performance of the transistor and is therefore undesirable. As such, an oxidation removal process 160 is performed to remove the oxidation material 150. In an embodiment, the oxidation removal process 160 includes a PCII Argon sputtering process. The Argon sputtering process uses a DC bias that is greater than about −120 volts and/or a process time that is less than about 12 seconds.

Figure 4:
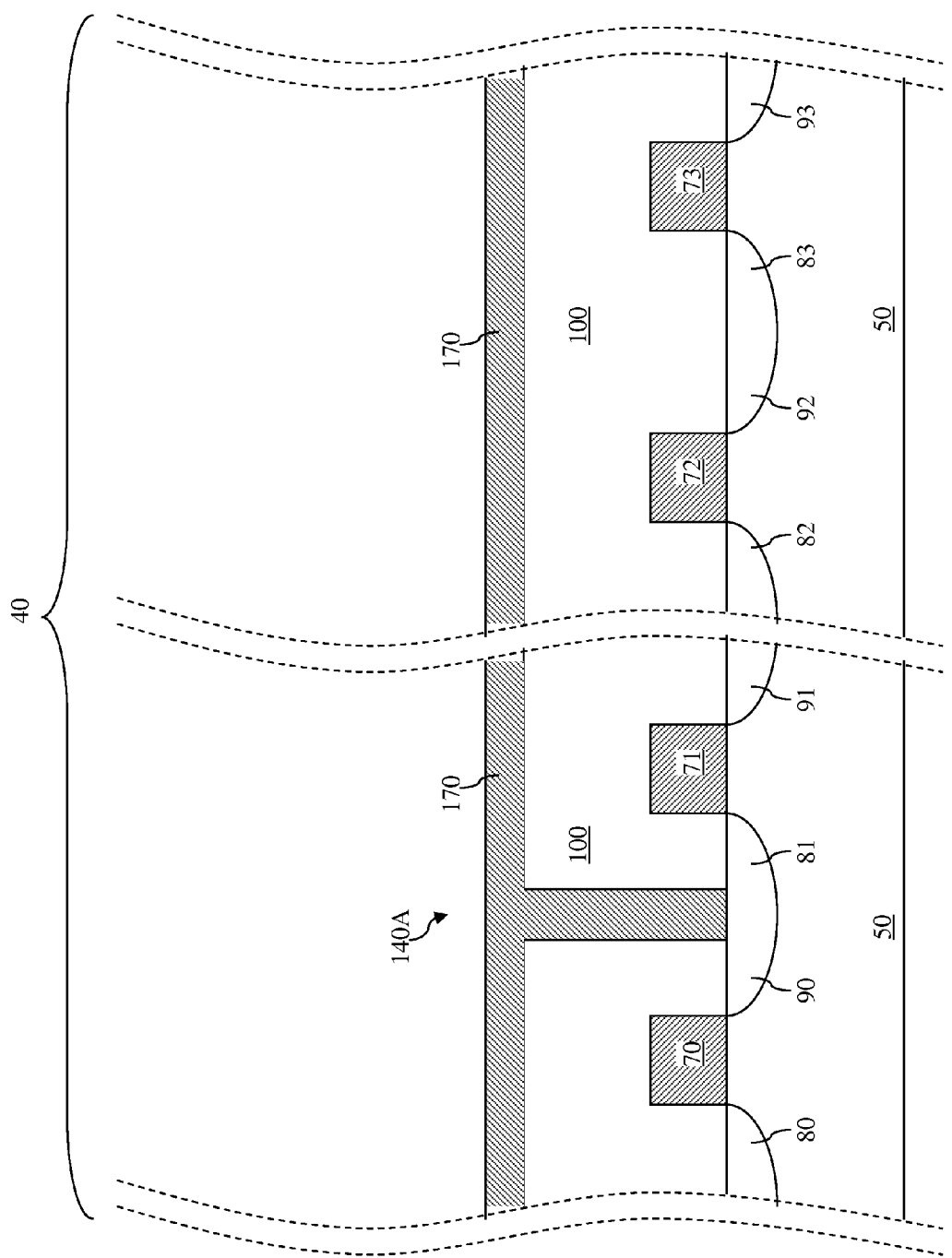

Referring now to FIG. 4, the oxidation material 150 is substantially removed by the oxidation removal process 160 (shown in FIG. 3). A conductive layer 170 is then formed over the dielectric layer 100. The conductive layer 170 is formed by a deposition process such as CVD, PVD, ALD, or combinations thereof. The opening 140A is filled by the conductive layer 170. In an embodiment, the conductive layer 170 includes Tungsten. The thickness 110 (shown in FIG. 2) of the dielectric layer 100 is smaller than the thickness of a typical ILD layer. Thus, the opening 140A has a reduced aspect ratio (depth divided by width) and is easier to fill.

It is understood that, before the conductive layer 170 is formed, a glue material (not illustrated) and a barrier material (not illustrated) may be formed on the exposed surfaces of the dielectric layer 100. The glue material helps increase adhesion between the conductive layer 170 and the dielectric layer 100, and the barrier material helps prevent or reduce diffusion between the conductive layer 170 and the dielectric layer 100.

Figure 5:
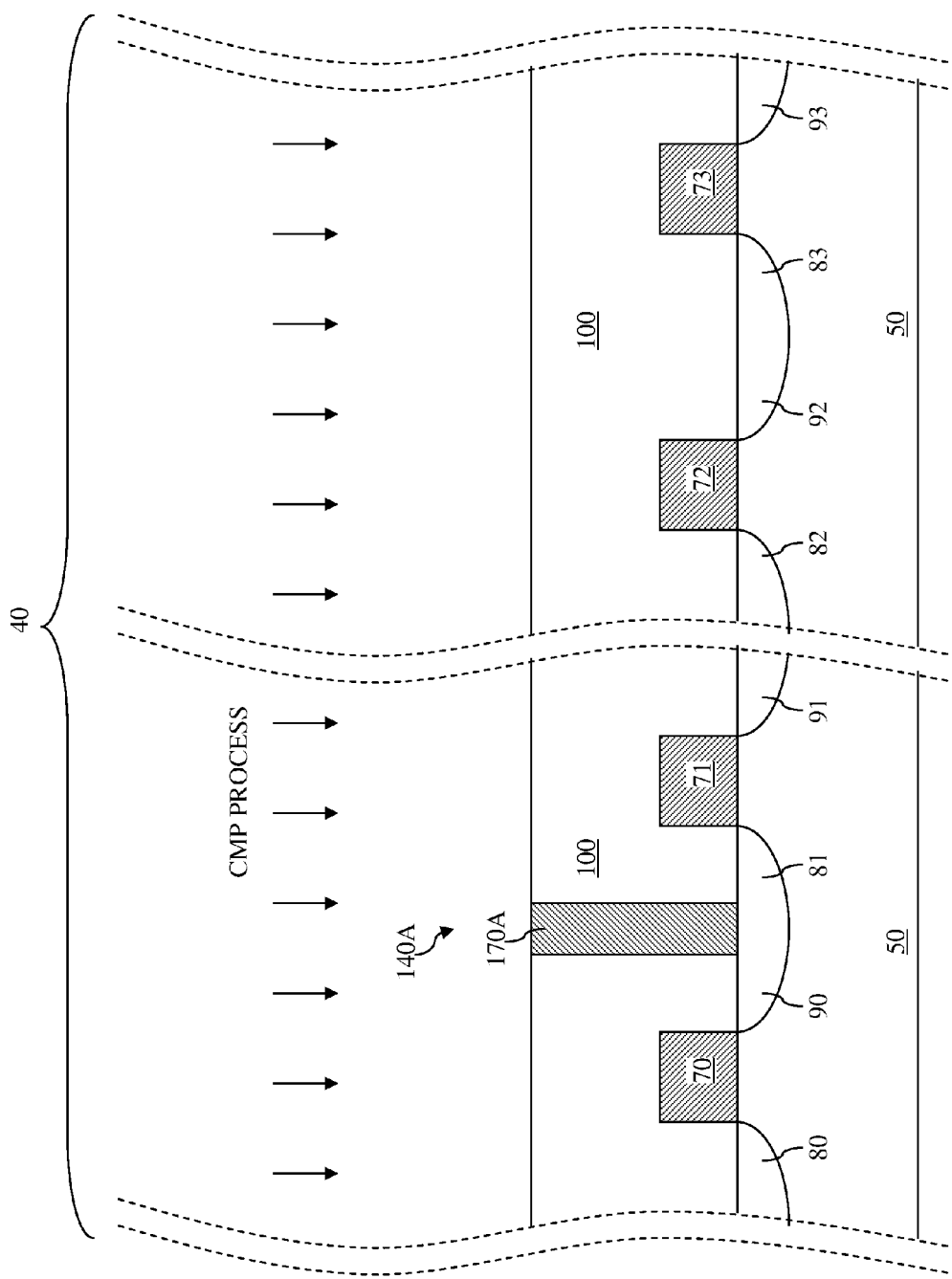

Referring now to FIG. 5, a chemical-mechanical-polishing (CMP) process is performed on the conductive layer 170 to remove portions thereof outside the opening 140A. The remaining portion of the conductive layer is a contact 170A that fills the opening 140A. The contact 170A is substantially co-planar with an upper surface of the dielectric layer 100 at this stage of fabrication. The contact 170A provides electrical connection between the source/drain regions 90 and 81 and external devices.

Figure 6:
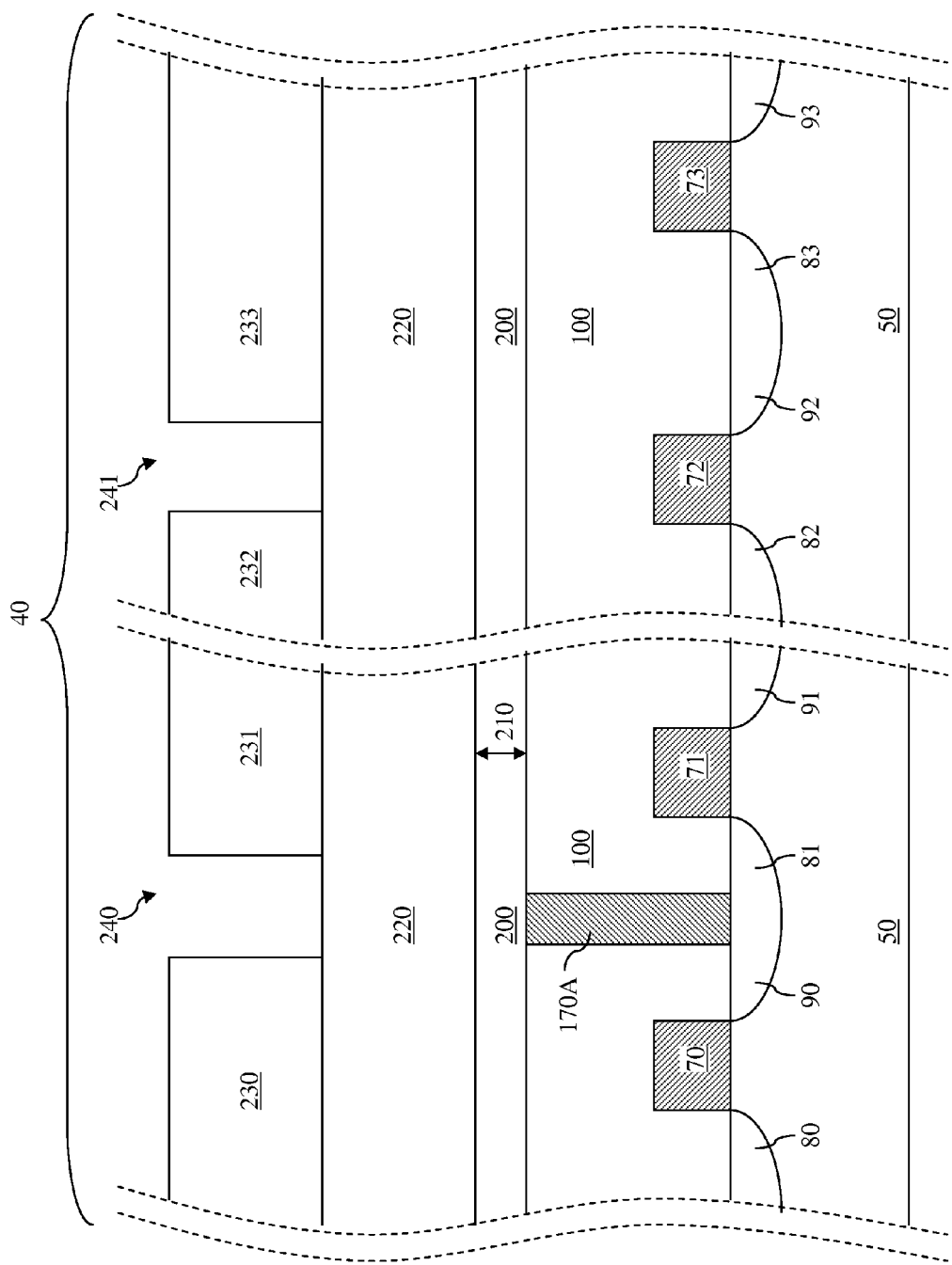

Referring now to FIG. 6, a dielectric layer 200 is formed over the dielectric layer 100. The dielectric layer 200 is formed by a deposition process known in the art, such as CVD, PVD, ALD, or combinations thereof. The dielectric layer 200 has a thickness 210. In an embodiment, the thickness 210 is in a range from about 700 Angstroms to about 1000 Angstroms. The dielectric layer 200 includes substantially the same materials as the dielectric layer 100, and as such may be considered an extension of the dielectric layer 100. In other words, the formation of the dielectric layer 200 in effect "thickens" the dielectric layer 100. In an embodiment, the thickness of the combined dielectric layers 100 and 200 (the total thickness of the ILD layer) is in a range from about 700 Angstroms to about 2000 Angstroms.

An intermediate layer 220 is formed over the dielectric layer 200. The intermediate layer 220 is substantially similar to the intermediate layer 120 described above with reference to FIG. 2. For example, the intermediate layer 220 may also include a BARC layer, a DARC layer, and an ARD layer, or it may include a middle layer (silicon-rich BARC layer) and a bottom layer (photoresist layer).

A patterned photoresist layer that includes photoresist portions 230-233 is then formed over the intermediate layer 220. The patterned photoresist layer is formed in a similar manner as the patterned photoresist layer discussed above with reference to FIG. 2. The photoresist portions 230-231 are separated by an opening 240, and the photoresist portions 232-233 are separated by an opening 241. The opening 240 is located above the contact 170A, and the opening 241 is located above the gate 72.

Figure 7:
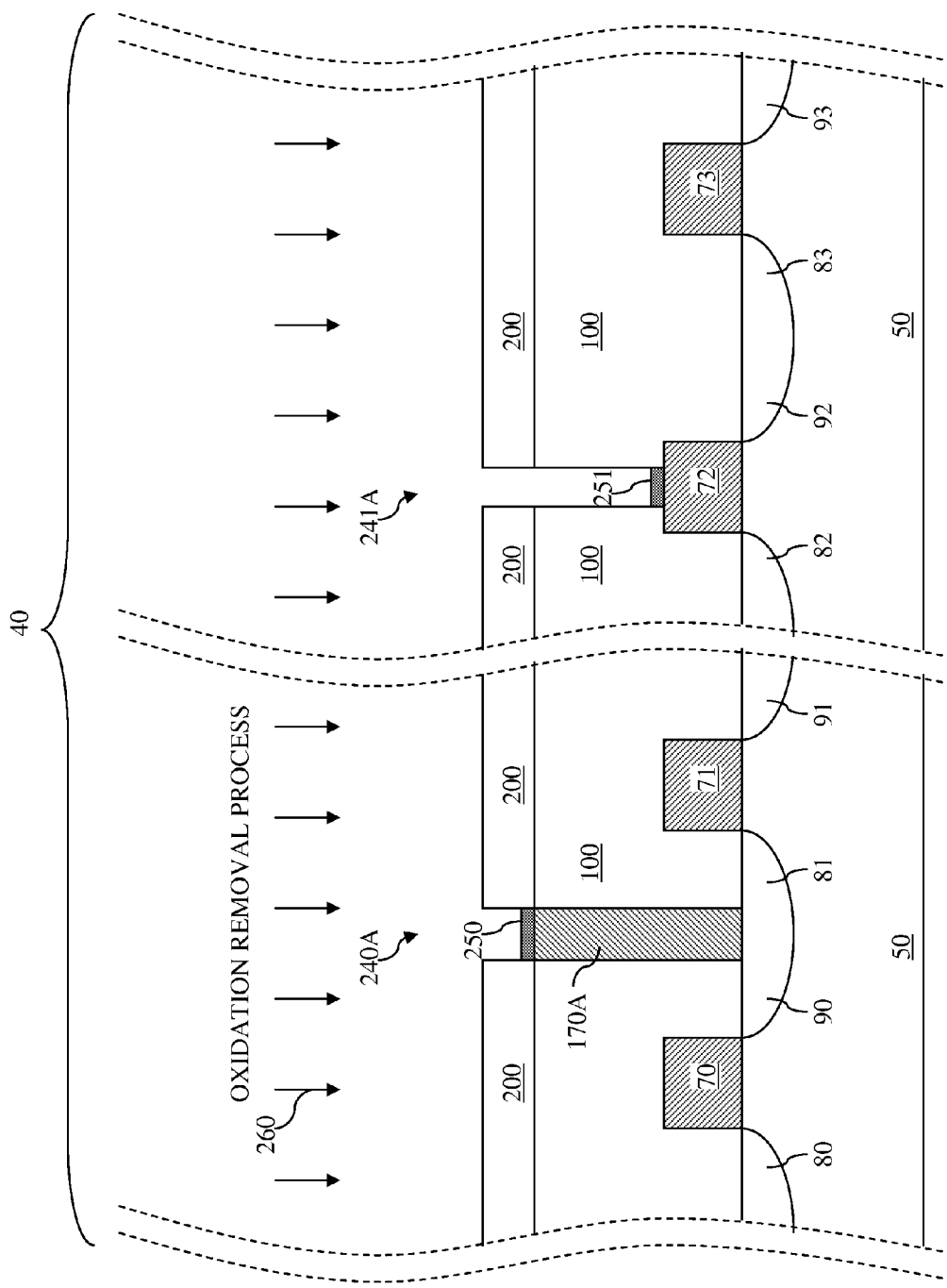

Referring now to FIG. 7, using an etching process, the openings 240 and 241 are extended further downwards until the contact 170A and an upper surface of the gate 72 are exposed. The intermediate layer 220 and the photoresist portions 230-233 are then removed. At this stage of fabrication, the openings 240 and 241 become openings 240A and 241A, respectively. It is understood that the openings 240A and 241A are narrower than the openings 240 and 241, respectively.

A wet cleaning process is performed to clean the surfaces of the semiconductor device 40 after the etching process (that forms the openings 240A-241A) is performed. The wet cleaning process uses a substantially acid-free cleaning agent. For example, the cleaning agent may be de-ionized water.

Due to exposure to oxygen in the air, an oxidation material 250 is formed on the exposed upper surface of the contact 170A, and an oxidation material 251 is formed on the exposed upper surface of the gate 72. The oxidation materials 250-251 may be metal oxides, for example aluminum oxide. Since the oxidation materials 250-251 are formed on metal materials, they are thicker than the oxidation material 150, which was formed on a silicide material such as nickel silicide.

As mentioned above, such oxidation materials should be removed due to undesired resistance increases. Therefore, an oxidation removal process 260 is performed to remove the oxidation materials 250-251. In an embodiment, the oxidation removal process 260 includes a PCII Argon sputtering process. The Argon sputtering process of the oxidation removal process 260 has greater intensity than the Argon sputtering process of the oxidation removal process 160. Hence, the oxidation removal process 260 is more powerful than the oxidation removal process 160. This is because the oxidation material 150 removed by the oxidation removal process 160 is thinner than the oxidation materials 250-251 removed by the oxidation removal process 260. In other words, a stronger sputtering process is needed to remove the thicker oxidation materials 250-251. This stronger Argon sputtering process of the oxidation removal process 260 has a DC bias voltage that is less than −120 volts and/or a process time that is greater than about 12 seconds. Consequently, the stronger Argon sputtering process is capable of removing 2-3 times as much oxidation material as the weaker Argon sputtering process of the oxidation removal process 160 (shown in FIG. 3).

Figure 8:
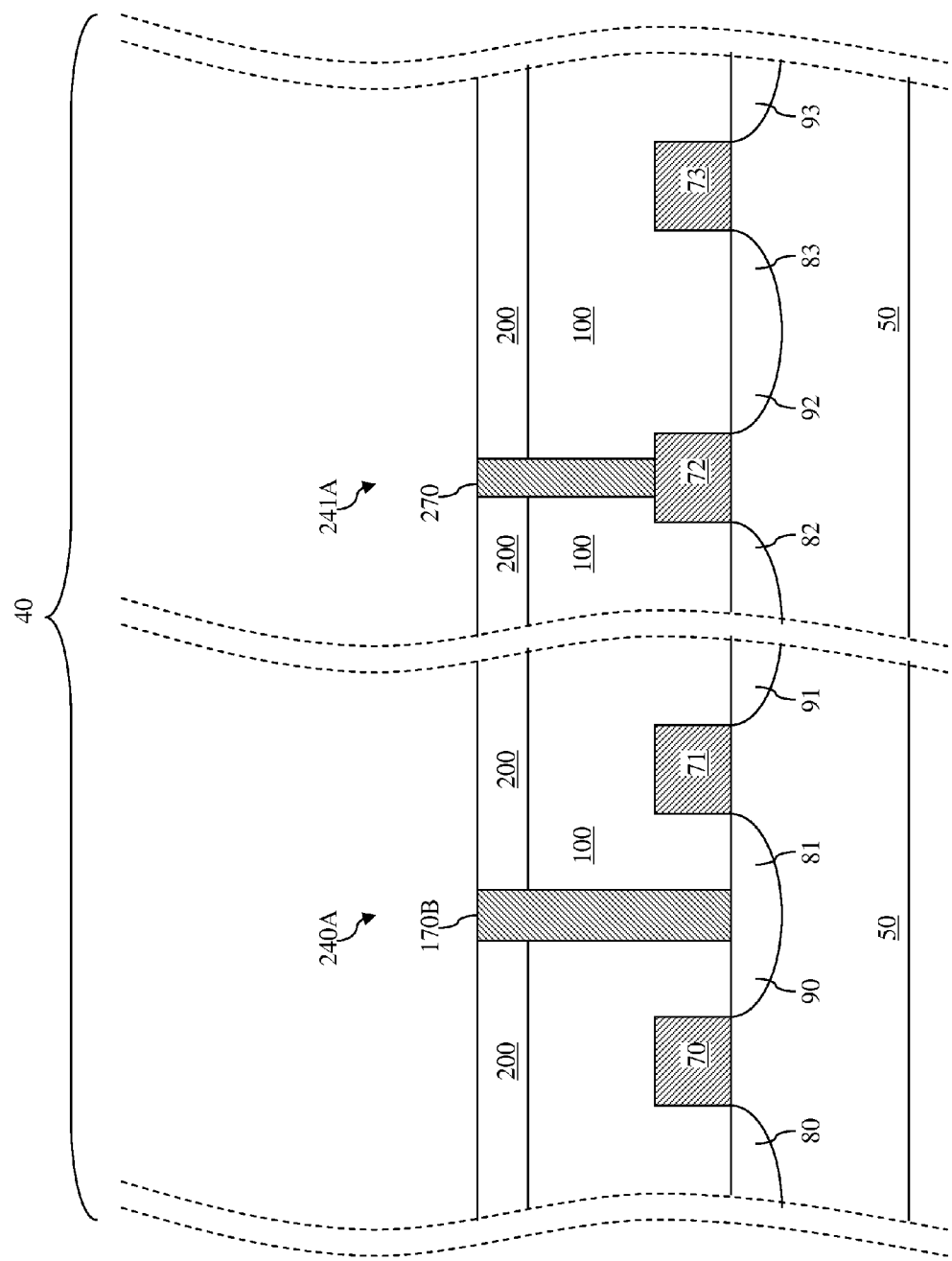

Referring now to FIG. 8, the oxidation materials 250-251 are removed, and a deposition process known in the art is performed to fill the openings 240A and 241A with a conductive material. As a result, contacts 170B and 270 are formed in the openings 240A and 241A, respectively. The contact 170B provides electrical connections between the source/drain regions 90 and 81 and external devices, and the contact 270 provides electrical connections between the gate 72 and external devices.

Additional fabrication processes may be performed to complete the fabrication of the semiconductor device 40. For example, additional interconnect layers containing metal lines may be formed over the dielectric layer 200. An interconnect structure is collectively formed by these additional interconnect layers, the dielectric layers 100 and 200, and the contacts such as the contacts 170B and 270. Moreover, the semiconductor device 30 may undergo various passivation, slicing, and packaging processes. For the sake of simplicity, these additional processes are not described herein.

The various embodiments of the present disclosure offer advantages, it being understood that different embodiments may offer different advantages, and that no particular advantage is required for all embodiments. One of the advantages is that the oxidation materials can be thoroughly removed without damaging any part of the semiconductor device 40. In more detail, the present disclosure employs a two-step approach to remove the oxidation materials.

In the first stage (shown in FIG. 3), the oxidation material 150 (formed on a silicide surface) over a portion of the source/drain regions 90 and 81 is removed. Since the oxidation material 150 is formed on the silicide surface, the oxidation material is not very thick and can be relatively easily removed. As such, the Argon sputtering process of the oxidation removal process 160 can be tuned to have a relatively low intensity. This ensures that the silicide surface underneath the oxidation material 150 will not be punched through during the sputtering process.

In the second stage (shown in FIG. 7), the oxidation materials 250-251 (formed on metal surfaces) over the contact 170A and the gate 72, respectively, are removed. Since the oxidation materials 250-251 are formed on metal surfaces, the oxidation materials are relatively thick—much thicker than the oxidation material 150 that is formed on the silicide surface in the first stage. Consequently, the oxidation materials 250-251 cannot be easily removed. As such, the Argon sputtering process of the oxidation removal process 260 can be tuned to have an intensity that is sufficiently high so as to ensure the substantial removal of the oxidation materials 250-251. Since the silicide above the source/drain regions 90 and 81 is already covered by the contact 170A, the high intensity of the sputtering process will not cause damage to the protected silicide.

Stated differently, the two-stage oxidation removal method described above has good oxidation removal performance while avoiding causing damage to the semiconductor device 40. No tradeoff needs to be made between device integrity (avoiding silicide punch-through) and performance (having low contact resistance as a result of complete oxidation removal).

Another advantage offered by the embodiments of the present disclosure is that the ILD dielectric layer is formed in two stages as well. In the first stage, the dielectric layer 100 is formed, which has a reduced thickness compared to traditional ILD layers. This reduced thickness allows for a smaller aspect ratio of the opening (to be filled to form a contact) compared to traditional devices. Consequently, it is easier to fill this opening to form the contact 170A, and a wider contact process window can be achieved due to the low aspect ratio. In the second stage, the dielectric layer 100 is effectively "thickened" by the dielectric layer 200 formed thereover. It may be desirable to not sacrifice overall ILD thickness for other fabrication concerns. Here, the overall thickness of the ILD layer can still be maintained by thickening the dielectric layer 100 with the dielectric layer 200. Thus, the present disclosure offers a way to achieve a small aspect ratio and to maintain the overall ILD thickness.

Furthermore, in previous contact formation methods, an acid-containing cleaning agent is usually required to wash away metal oxide, for example metal oxide that naturally forms on an exposed surface of a metal gate. In comparison, since the Argon sputtering process of the oxidation removal process 260 effectively removes oxidation material 251 formed on the gate 72, the wet cleaning process performed thereafter can be substantially acid-free. This simplifies fabrication processes and reduces fabrication costs.

It is also understood that the two stages of oxidation removal can be reversed. For example, in an alternative embodiment, the opening 241A exposing the gate 72 may be formed first, which is followed by the stronger Argon sputtering process to remove the oxidation material formed on the gate surface. Thereafter, the opening 140A exposing the source/drain regions 90 and 81 may be formed, and a weaker Argon sputtering process is performed to remove the oxidation material formed on the source/drain region surface. This alternative embodiment achieves substantially the same advantages offered by the embodiment shown in FIGS. 2-8.

One of the broader forms of the present disclosure involves method. The method includes: providing a substrate having a source/drain region, the substrate having a metal gate formed thereon; forming a dielectric layer over the substrate, the dielectric layer covering the source/drain region and the metal gate; forming a first opening in the dielectric layer, the first opening extending through the dielectric layer and exposing a first surface; performing a first oxidation removal process to remove a first oxidation material formed on the first surface; filling the first opening with a metal material; forming a second opening in the dielectric layer, the second opening extending through the dielectric layer and exposing a second surface; and performing a second oxidation removal process to remove a second oxidation material formed on the second surface; wherein: the first surface is a surface of one of: the metal gate and the source/drain region; the second surface is a surface of the other one of: the metal gate and the source/drain region; and the first and second oxidation removal processes have different intensities.

Another of the broader forms of the present disclosure involves a method. The method includes: forming a layer over a substrate; forming a first opening in the layer that exposes a first region of the substrate; removing a first oxidation layer formed over the first region through a first sputtering process; filling the first opening with a conductive material; forming a second opening in the layer that exposes a second region of the substrate, the second region being different from the first region; and removing a second oxidation layer formed over the second region through a second sputtering process; wherein one of the first and second sputtering processes is more powerful than the other.

Still another of the broader forms of the present disclosure involves a method. The method includes: providing a wafer having an inter-layer dielectric (ILD) layer that is formed over an active region and a metal gate of the wafer; etching a first opening in the ILD layer to expose one of: the metal gate and a portion of the active region; performing a first sputtering process with respect to the first opening; filling the first opening with a metal material; etching a second opening in the ILD layer, the second opening being different from the first opening and exposing the other one of: the metal gate and the portion of the active region; and performing a second sputtering process with respect to the second opening; wherein one of the first and second sputtering processes is more intense than the other.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further, the PMOS device may be disposed in a deep doped well pocket for isolating the device.

What is claimed is:

1. A method, comprising:
   providing a substrate having a source/drain region, the substrate having a metal gate formed thereon;
   forming a dielectric layer over the substrate, the dielectric layer covering the source/drain region and the metal gate;
   forming a first opening in the dielectric layer, the first opening extending through the dielectric layer and exposing a first surface;
   performing a first oxidation removal process to remove a first oxidation material formed on the first surface;
   filling the first opening with a metal material;
   forming a second opening in the dielectric layer, the second opening extending through the dielectric layer and exposing a second surface; and
   performing a second oxidation removal process to remove a second oxidation material formed on the second surface;
   wherein:
   the first surface is a surface of one of: the metal gate and the source/drain region;
   the second surface is a surface of the other one of: the metal gate and the source/drain region; and
   the first and second oxidation removal processes have different intensities measured in terms of at least direct-current (DC) voltage bias.

2. The method of claim 1, wherein the intensity of the first and second oxidation removal processes is further measured in terms of process time.

3. The method of claim 1, wherein:
   the first surface is the surface of the source/drain region, the first surface being silicided;
   the second surface is the surface of the metal gate;
   the first and second oxidation removal processes each include an Argon sputtering process; and
   the Argon sputtering process associated with the second oxidation removal process has greater intensity than the Argon sputtering process associated with the first oxidation removal process.

4. The method of claim 1, wherein:
   the first surface is the surface of the metal gate;
   the second surface is the surface of the source/drain region, the second surface being silicided;
   the first and second oxidation removal processes each include an Argon sputtering process; and the Argon sputtering process associated with the first oxidation removal process has greater intensity than the Argon sputtering process associated with the second oxidation removal process.

5. The method of claim 1, further including: after the filling the first opening, forming an additional dielectric material over the dielectric layer, thereby increasing a thickness of the dielectric layer.

6. The method of claim 1, further including:
after the forming the first opening, performing a first wet cleaning process on surfaces along the first opening; and
after the forming the second opening, performing a second wet cleaning process on surfaces along the second opening;
wherein both the first and second wet cleaning processes use a cleaning agent that is substantially acid-free.

7. The method of claim 1, further including: after the performing the second oxidation removal process, filling the second opening with the same metal material that fills the first opening;
wherein the metal material filling the first and second openings includes Tungsten.

8. The method of claim 1, further including:
after the forming the dielectric layer:
  forming a first intermediate layer over the dielectric layer; and
  forming a first patterned photoresist layer over the first intermediate layer, the first patterned photoresist layer having a third opening;
  wherein the forming the first opening includes etching the third opening through the first intermediate layer and the dielectric layer to form the first opening; and
after the filling the first opening:
  forming a second intermediate layer over the dielectric layer; and
  forming a second patterned photoresist layer over the second intermediate layer, the second patterned photoresist layer having a fourth opening;
  wherein the forming the second opening includes etching the fourth opening through the second intermediate layer and the dielectric layer to form the second opening.

9. The method of claim 8, wherein the third opening is wider than the first opening, and the fourth opening is wider than the second opening.

10. A method, comprising:
forming a layer over a substrate;
forming a first opening in the layer that exposes a first region of the substrate;
removing a first oxidation layer formed over the first region through a first sputtering process;
filling the first opening with a conductive material;
forming a second opening in the layer that exposes a second region of the substrate, the second region being different from the first region; and
removing a second oxidation layer formed over the second region through a second sputtering process;
wherein one of the first and second sputtering processes is more powerful than the other.

11. The method of claim 10, wherein the more powerful one of the first and second sputtering processes has a more negative direct-current (DC) bias voltage and a longer process duration.

12. The method of claim 10, wherein the first and second sputtering processes each include an Argon sputtering process.

13. The method of claim 10, wherein the oxidation layer that is removed by the more powerful one of the first and second sputtering processes includes a metal oxide.

14. The method of claim 10, wherein:
the first region includes a source/drain region;
the second region includes a metal gate; and
the second sputtering process is more powerful than the first sputtering process.

15. The method of claim 10, wherein:
the first region includes a metal gate;
the second region includes a source/drain region; and
the first sputtering process is more powerful than the second sputtering process.

16. The method of claim 10, wherein the layer in which the first and second openings are formed is an inter-layer dielectric (ILD) layer.

17. The method of claim 16, further including: after the filling the first opening, and before the forming the second opening, thickening the ILD layer.

18. A method, comprising:
providing a wafer having an inter-layer dielectric (ILD) layer that is formed over an active region and a metal gate of the wafer;
etching a first opening in the ILD layer to expose one of: the metal gate and a portion of the active region;
performing a first sputtering process with respect to the first opening;
filling the first opening with a metal material;
etching a second opening in the ILD layer, the second opening being different from the first opening and exposing the other one of: the metal gate and the portion of the active region; and
performing a second sputtering process with respect to the second opening;
wherein one of the first and second sputtering processes is more intense than the other.

19. The method of claim 18, wherein:
the portion of the active region is a source/drain region;
the first and second sputtering processes each include an Argon sputtering process;
the more intense one of the first and second sputtering processes has a more negative bias voltage as well as a longer process time than the other; and
the more intense of the first and second sputtering process is performed to the opening exposing the metal gate.

20. The method of claim 18, further including:
after the filling the first opening and before the etching the second opening, increasing a thickness of the ILD layer; and
cleaning the first opening after the etching the first opening and cleaning the second opening after the etching the second opening, the cleaning being carried out using an acid-free cleaning agent.

* * * * *